United States Patent
Nakamura et al.

(10) Patent No.: US 9,691,890 B2
(45) Date of Patent: Jun. 27, 2017

(54) COMPOUND SEMICONDUCTOR DEVICE AND MANUFACTURING METHOD THEREOF

(71) Applicant: FUJITSU LIMITED, Kawasaki-shi, Kanagawa (JP)

(72) Inventors: Norikazu Nakamura, Sagamihara (JP); Atsushi Yamada, Isehara (JP); Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/283,873

(22) Filed: Oct. 3, 2016

(65) Prior Publication Data

US 2017/0125566 A1 May 4, 2017

(30) Foreign Application Priority Data

Oct. 30, 2015 (JP) ................. 2015-215107

(51) Int. Cl.
| | | |
|---|---|---|
| *H01L 31/0256* | (2006.01) | |
| *H01L 35/24* | (2006.01) | |
| *H01L 51/00* | (2006.01) | |
| *H01L 21/338* | (2006.01) | |
| *H01L 29/778* | (2006.01) | |
| *H01L 29/20* | (2006.01) | |
| *H01L 29/205* | (2006.01) | |
| *H01L 29/66* | (2006.01) | |
| *H02M 3/335* | (2006.01) | |
| *H03F 3/19* | (2006.01) | |

(Continued)

(52) U.S. Cl.
CPC ...... *H01L 29/7787* (2013.01); *H01L 29/2003* (2013.01); *H01L 29/205* (2013.01); *H01L 29/66462* (2013.01); *H02M 3/33507* (2013.01); *H03F 1/3241* (2013.01); *H03F 3/19* (2013.01); *H03F 3/21* (2013.01); *H03F 2200/333* (2013.01)

(58) Field of Classification Search
CPC ............... H01L 29/7785; H01L 29/151; H01L 29/2003; H01L 29/205; H01L 29/7787
USPC ...................................... 257/20, 76; 438/172
See application file for complete search history.

(56) References Cited

U.S. PATENT DOCUMENTS

2011/0272742 A1* 11/2011 Akiyama ............ H01L 21/324
257/194
2012/0205663 A1* 8/2012 Nakamura ............ H01L 23/291
257/76

(Continued)

FOREIGN PATENT DOCUMENTS

| JP | 2005-191477 A | 7/2005 |
| JP | 2007-200975 A | 8/2007 |

*Primary Examiner* — David S Blum
(74) *Attorney, Agent, or Firm* — Fujitsu Patent Center

(57) ABSTRACT

A compound semiconductor device includes a compound semiconductor stacked structure, the compound semiconductor stacked structure including: an electron transit layer; an electron supply layer formed above the electron transit layer, the electron supply layer containing an n-type impurity; and a cap layer formed above the electron supply layer and containing the n-type impurity, in which in the electron supply layer, a concentration of the n-type impurity contained therein is non-uniform in a film thickness direction and a concentration of the n-type impurity in a surface of the cap layer side is lower than a maximum concentration of the n-type impurity in the electron supply layer.

12 Claims, 12 Drawing Sheets

(51) Int. Cl.
   *H03F 1/32*  (2006.01)
   *H03F 3/21*  (2006.01)

(56) References Cited

U.S. PATENT DOCUMENTS

2013/0316507 A1* 11/2013 Saitoh ................. H01L 29/2003
                                                              438/285
2015/0090957 A1*  4/2015 Tomabechi ........... H01L 29/155
                                                               257/20
2015/0279982 A1* 10/2015 Yamamoto ........ H01L 29/42316
                                                               257/76

* cited by examiner

CONVENTIONAL EXAMPLE
SURFACE SHAPE

CONVENTIONAL EXAMPLE
IV IMAGE IN THE SAME REGION (THE BLACKER COLOR IS, THE LEAKIER CURRENT IS)

THIS EMBODIMENT
SURFACE SHAPE

THIS EMBODIMENT
IV IMAGE IN THE SAME REGION (THE BLACKER COLOR IS, THE LEAKIER CURRENT IS)

COMPOUND SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2015-215107, filed on Oct. 30, 2015 the entire contents of which are incorporated herein by reference.

FIELD

The embodiments discussed herein are directed to a compound semiconductor device and a manufacturing method thereof.

BACKGROUND

There has been considered application of a nitride semiconductor to a high-withstand-voltage and high-power semiconductor device by utilizing its characteristics such as a high saturation electron velocity and a wide band gap. For example, GaN which is a nitride semiconductor has a band gap of 3.4 eV, which is larger than a band gap (1.1 eV) of Si and a band gap (1.4 eV) of GaAs, and GaN has high breakdown electric field intensity. This makes GaN very promising as a material of a semiconductor device for power supply which obtains high voltage operation and high power.

As a semiconductor device using a nitride semiconductor, many reports on a field effect transistor, particularly a high electron mobility transistor (HEMT) have been made. For example, in a GaN-based HEMT (GaN-HEMT), an AlGaN/GaN HEMT using GaN as an electron transit layer and AlGaN as an electron supply layer has been receiving attention. In the AlGaN/GaN HEMT, distortion caused by a lattice constant difference between GaN and AlGaN occurs in AlGaN. By piezoelectric polarization caused by the above and spontaneous polarization of AlGaN, high-concentration two-dimensional electron gas (2DEG) is obtained. Therefore, the AlGaN/GaN HEMT is expected as a high-withstand-voltage power device for a high-efficiency switch element, an electric vehicle, or the like.

[Patent Document 1] Japanese Laid-open Patent Publication No. 2007-200975

[Patent Document 2] Japanese Laid-open Patent Publication No. 2005-191477

FIG. 9 is a schematic cross-sectional view schematically illustrating a configuration of a compound semiconductor stacked structure in a conventional AlGaN/GaN HEMT.

A compound semiconductor stacked structure 102 is formed on, for example, a SiC substrate 101. The compound semiconductor stacked structure 102 is constituted by stacking a non-illustrated nucleus formation layer made of AlN or the like, a buffer layer 102a made of AlGaN or the like, an electron transit layer 102b made of GaN, an electron supply layer 102c made of AlGaN or the like, and a cap layer 102d made of GaN or the like. To the electron supply layer 102c and the cap layer 102d, an n-type impurity (n-type dopant) of Si or the like is added. The addition of the n-type dopant aims at an increase in two-dimensional electron gas (2DEG) or the like in the electron supply layer 102c and at improvement in an ohmic characteristic between the cap layer 102d and an electrode formed thereon and relaxation of an electric field concentration or the like in the cap layer 102d. Achieving these aims is intended for higher power and higher efficiency of the AlGaN/GaN HEMT.

FIG. 10A to FIG. 10C are schematic views for explaining problems in the conventional AlGaN/GaN HEMT.

In growth of a GaN crystal by using a metal organic vapor phase epitaxy (MOVPE) method, for the purpose of preventing carbon which easily becomes a disturbing factor in device performance from mixing, the growth is generally performed at a pressure of, for example, 200 mbar or more. On the other hand, in layers containing Al such as the electron supply layer or the like, growth is to be performed under relatively low pressures in order to suppress a vapor phase reaction before the growth (FIG. 10A).

When the compound semiconductor stacked structure 102 illustrated in FIG. 9 is formed, a growth condition is usually changed for the purpose of enhancing film quality of the cap layer 102d after forming the electron supply layer 102c containing Al (FIG. 10B). As a result, switching time (growth interruption time) during which the pressure is increased to become stable occurs. However, when growth interruption is performed under high temperatures, desorption of gallium and nitrogen which are constituent elements of the electron supply layer 102c occurs and the n-type dopant is concentrated on an uppermost surface of the electron supply layer 102c (FIG. 10C). Excessive existence of the n-type dopant causes a defect in a film. Accordingly, the AlGaN/GaN HEMT using a crystal structure such as the compound semiconductor stacked structure 102 has problems that a threshold shift referred to as collapse, a withstand-voltage deterioration starting from the defect, and a deterioration of a leak characteristic occur to greatly impair design performance and reliability.

SUMMARY

A compound semiconductor device according to an aspect includes a compound semiconductor stacked structure, the compound semiconductor stacked structure including: an electron transit layer; an electron supply layer formed above the electron transit layer, the electron supply layer containing an n-type impurity; and a cap layer formed above the electron supply layer, wherein in the electron supply layer, a concentration of the n-type impurity contained therein is non-uniform in a film thickness direction and a concentration of the n-type impurity in a surface of the cap layer side is lower than a maximum concentration of the n-type impurity in the electron supply layer.

A manufacturing method of a compound semiconductor device according to an aspect includes forming a compound semiconductor stacked structure, the compound semiconductor stacked structure including: an electron transit layer; an electron supply layer formed above the electron transit layer, the electron supply layer containing an n-type impurity; and a cap layer formed above the electron supply layer, wherein the electron supply layer is formed so that a concentration of the n-type impurity contained therein is non-uniform in a film thickness direction and a concentration of the n-type impurity in a surface of the cap layer side is lower than a maximum concentration of the n-type impurity in the electron supply layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, an AlGaN/GaN HEMT of a nitride semiconductor is disclosed as a compound semiconductor device.

FIG. 1A to FIG. 4 are schematic cross-sectional views illustrating a manufacturing method of the AlGaN/GaN HEMT according to the first embodiment in order of steps.

Figure 1A:
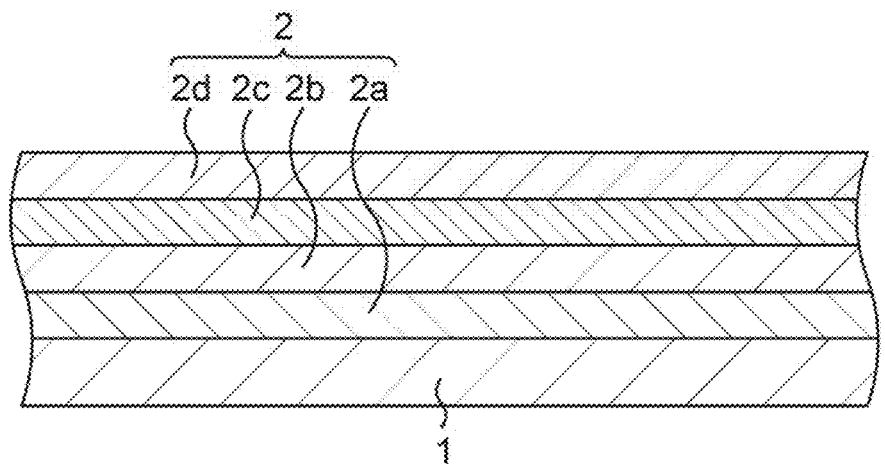
FIG. 1A to FIG. 1C are schematic cross-sectional views illustrating a manufacturing method of an AlGaN/GaN HEMT according to a first embodiment in order of steps.

First, as illustrated in FIG. 1A, a compound semiconductor stacked structure 2 is formed on, for example, a SiC substrate 1 as a growth substrate. As the growth substrate, a Si substrate, a sapphire substrate, a GaAs substrate, a GaN substrate, or the like may be used instead of the SiC substrate. Further, with regard to conductivity of the substrate, whether the substrate is semi-insulating or conductive does not matter.

The compound semiconductor stacked structure 2 is constituted to have a non-illustrated nucleus formation layer, a buffer layer 2a, an electron transit layer 2b, an electron supply layer 2c, and a cap layer 2d. In order to suppress a decrease in mobility due to occurrence of alloy scattering between the electron transit layer 2b and the electron supply layer 2c, a thin spacer layer made of AlN, ALGaN, or the like may be formed therebetween.

In the completed AlGaN/GaN HEMT, at a time of its operation, two-dimensional electron gas (2DEG) is generated in the vicinity of an interface with the electron supply layer 2c, of the electron transit layer 2b. This 2DEG is generated based on a difference in lattice constant between a compound semiconductor (here, GaN) of the electron transit layer 2b and a compound semiconductor (here, AlGaN) of the electron supply layer 2c.

In detail, each of the following compound semiconductors is grown on the SiC substrate 1 by, for example, a MOCVD method. A molecular beam epitaxy (MBE) method or the like may be used instead of the MOVPE method.

On the SiC substrate 1, AlN is grown to have a thickness of about 5 nm, i (intentionally undoped)-GaN is grown to have a thickness of about 1 μm, i-AlGaN is grown to have a thickness of about 5 nm, n-AlGaN is grown to have a thickness of about 30 nm, and n-GaN is grown to have a thickness of about 3 nm, in sequence. Consequently, the buffer layer 2a, the electron transit layer 2b, the electron supply layer 2c, and the cap layer 2d are formed. As the buffer layer 2a, AlGaN may be used instead of AlN, or GaN may be grown by low temperature growth. Further, in order to suppress occurrence of collapse, the buffer layer 2a may be doped with an impurity such as Fe forming a deep level. Further, the cap layer 2d may be formed of AlGaN instead of GaN.

As a growth condition of AlN, mixed gas of trimethyl-aluminium (TMA) gas and ammonia ($NH_3$) gas is used as source gas. As a growth condition of GaN, mixed gas of trimethylgallium (TMG) gas and ammonia ($NH_3$) gas is used as source gas. As a growth condition of AlGaN, mixed gas of TMA gas, TMG gas, and $NH_3$ gas is used as source gas. Presence/absence of supply of the TMA gas which is an Al source and the TMG gas which is a Ga source and their flow rates are set appropriately according to compound semiconductor layers to be grown. A flow rate of the $NH_3$ gas which is a common source is set to be about 100 ccm to 10 LM. Further, a growth pressure is set to be about 50 Torr to 300 Torr, and a growth temperature is set to be about 1000° C. to 1200° C.

In growing GaN and AlGaN as n-type ones, for example, $SiH_4$ gas containing, for example, Si is added as an n-type impurity to the source gas at a predetermined flow rate, and GaN and AlGaN are doped with Si. A doping concentration of Si is set to be about $1 \times 10^{17}/cm^3$ to about $1 \times 10^{20}/cm^3$.

FIG. 3A to FIG. 3D are schematic views illustrating a configuration of the compound semiconductor stacked structure in the AlGaN/GaN HEMT according to this embodiment.

Specifically, each of the layers (nucleus formation layer, buffer layer 2a, electron transit layer 2b, electron supply layer 2c, and cap layer 2d (FIG. 3A)) constituting the compound semiconductor stacked structure 2 is formed, for example, as follows.

(Nucleus Formation Layer)

By the MOVPE method, AlN is grown under the condition that the growth temperature is about 1000° C. and the growth pressure is about 50 mbar, with TMA and $NH_3$ being the source gas, to form the nucleus formation layer.

(Buffer Layer 2a)

By the MOVPE method, AlGaN is grown under the condition that the growth temperature is about 1000° C. and the growth pressure is about 40 kPa, with TMG, TMA, and $NH_3$ being the source gas, to form the buffer layer 2a. The buffer layer 2a has a three-layer structure, and ratios of concentrations of Al and Ga are changed so that a first layer right over the nucleus formation layer becomes $Al_{0.8}Ga_{0.2}N$, a second layer stacked next becomes $Al_{0.5}Ga_{0.5}N$, and a third layer stacked finally becomes $Al_{0.2}Ga_{0.8}N$. Fe may be added as an impurity to the buffer layer 2a. For the addition of Fe, for example, cyclopentadienyl iron (CP$_2$Fe) is used.

(Electron Transit Layer 2b)

By the MOVPE method, i-GaN is grown under the condition that the growth temperature is about 1000° C. and the growth pressure is about 200 mbar, with TMG and NH$_3$ being the source gas, to form the electron transit layer 2b.

(Electron Supply Layer 2c)

By the MOVPE method, AlGaN is grown under the condition that the growth temperature is about 1000° C. and the growth pressure is about 50 mbar while AlGaN is doped with Si which is the n-type impurity, with TMG, TMA, and NH$_3$ being the source gas, to form the electron supply layer 2c. As the n-type impurity for doping, Ge or the like may be used instead of Si.

The electron supply layer 2c is formed in a manner that a concentration of Si which is the n-type impurity contained therein is non-uniform in a film thickness direction and that a concentration of Si in a surface (upper surface) of the cap layer 2d side is lower than a maximum concentration of Si in the electron supply layer 2c. With regard to the concentration of Si in a region of the electron transit layer 2b side from the vicinity of a region where the cap layer 2d and the electron supply layer 2c are in contact with each other in the electron supply layer 2c, when the concentration of Si is too low, a generation amount of 2DEG decreases, and hence the concentration of Si is preferably set to be $1 \times 10^{17}$/cm$^3$ or more in order to obtain predetermined 2DEG or more. Specifically, in a region 0.5 nm or more apart from the region where the cap layer 2d and the electron supply layer 2c are in contact with each other in the electron supply layer 2c, the concentration of Si is preferably set to be $1 \times 10^{17}$/cm$^3$ or more. Forming the electron supply layer 2c as described above makes it possible to keep the concentration of Si in the vicinity of an interface with the cap layer 2d, of the electron supply layer 2c as low as possible. Accordingly, even if desorption of gallium and nitrogen occurs due to interruption time after forming the electron supply layer 2c, the concentration of Si is kept low in the uppermost surface, so that occurrence of a condensation of Si in the uppermost surface of the electron supply layer 2c is suppressed. Due to this configuration, the AlGaN/GaN HEMT using the compound semiconductor stacked structure 2 suppresses collapse, a withstand-voltage deterioration starting from a defect, and a deterioration of a leak characteristic and achieves high design performance and high reliability.

As a specific Si concentration distribution to achieve the above-described distribution state, there is one, for example, illustrated in FIG. 3. In this Si concentration distribution, the concentration of Si which the electron supply layer 2c contains decreases gradually from a surface (lower surface) of the electron transit layer 2b side in the electron supply layer 2c toward the surface (upper surface) of the cap layer 2d side therein. Further, the Si concentration distribution illustrated in, for example, FIG. 3C is also applicable. In this Si concentration distribution, the concentration of Si which the electron supply layer 2c contains becomes the maximum concentration in the middle between the surface (lower surface) of the electron transit layer 2b side and the surface (upper surface) of the cap layer 2d side. The Si concentration distribution in FIG. 3C is proposed in consideration that the concentration of Si is preferably as low as possible in the vicinity of an interface with the electron transit layer 2b, of the electron supply layer 2c.

Figure 3A:
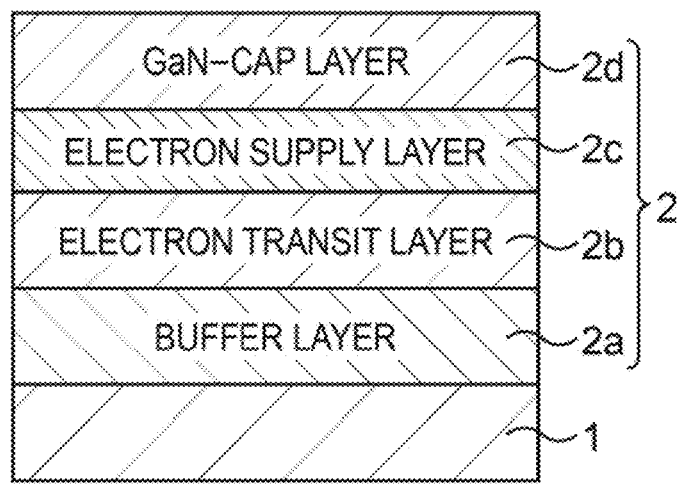
FIG. 3A to FIG. 3D are schematic cross-sectional views illustrating the manufacturing method of the AlGaN/GaN HEMT according to the first embodiment in order of steps, continuously from FIG. 2C.
Figure 3B:
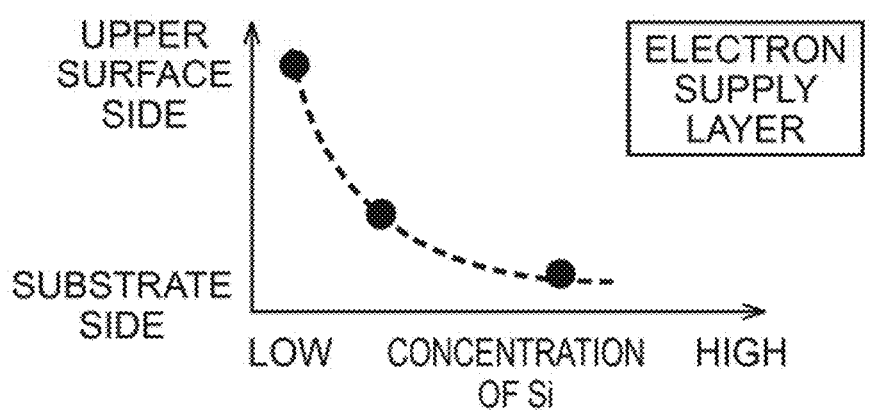

In order to obtain the Si concentration distribution in FIG. 3B, the Si doping is started with SiH$_4$ being the source gas simultaneously with growth of the electron supply layer 2c.

The flow rate of SiH$_4$ is decreased gradually, and the Si doping is halted when a film thickness of the electron supply layer 2c reaches a desired film thickness.

Figure 3C:
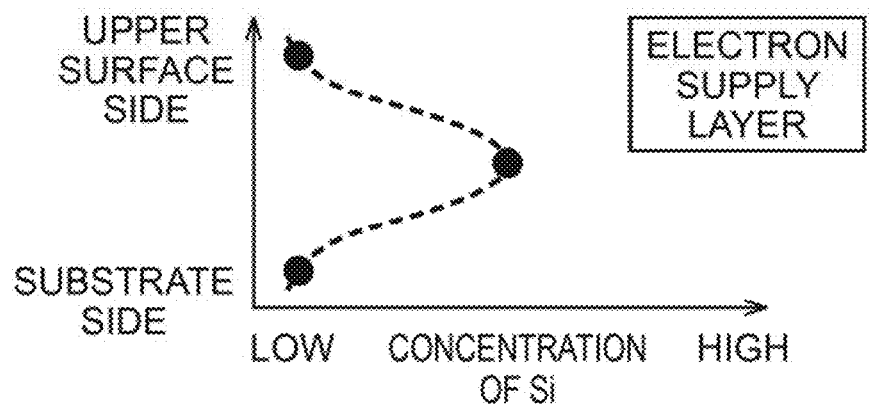

In order to obtain the Si concentration distribution in FIG. 3C, the Si doping is started with SiH$_4$ being the source gas simultaneously with the growth of the electron supply layer 2c. The flow rate of SiH$_4$ is increased gradually, and from when the film thickness of the electron supply layer 2c reaches a desired film thickness, the flow rate of SiH$_4$ is decreased gradually, and the Si doping is halted when the desired film thickness is reached.

(Cap Layer 2d)

By the MOVPE method, GaN is grown under the condition that the growth temperature is about 1000° C. and the growth pressure is about 200 mbar while GaN is doped with Si which is the n-type impurity, with TMG and NH$_3$ being the source gas, to form the cap layer 2d. As the n-type impurity for doping, Ge or the like may be used instead of Si.

Figure 3D:
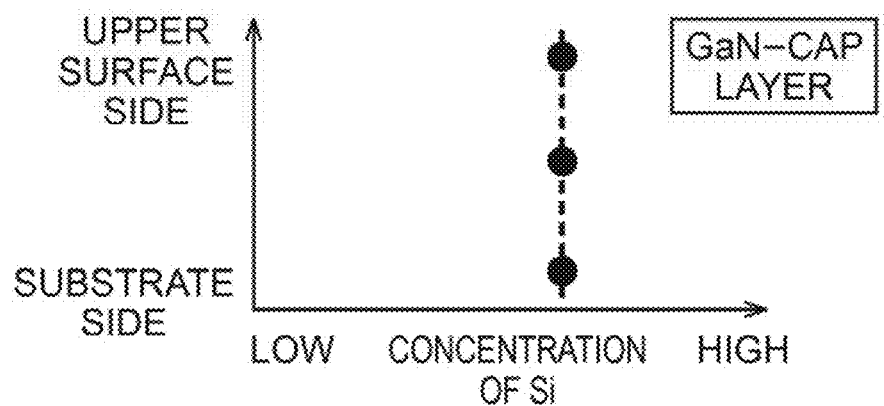

The cap layer 2d is formed to have the Si concentration distribution as illustrated in FIG. 3D. In this case, the Si doping is started at a constant flow rate with SiH$_4$ being the source gas simultaneously with growth of the cap layer 2d, and the doping is halted along with growth completion of the cap layer 2d.

Figure 1B:
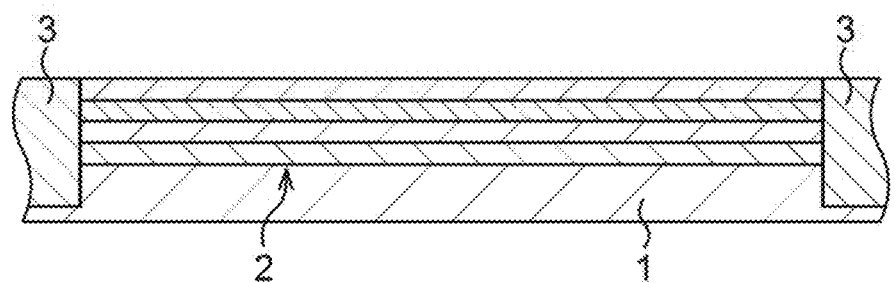

Subsequently, as illustrated in FIG. 1B, element isolation structures 3 are formed. From FIG. 2A onward, the illustration of the element isolation structure 3 is omitted.

In detail, argon (Ar), for example, is injected into element isolation regions of the compound semiconductor stacked structure 2. Consequently, the element isolation structures 3 are formed in the compound semiconductor stacked structure 2 and surface layer portions of the SiC substrate 1. By the element isolation structures 3, an active region is defined on the compound semiconductor stacked structure 2.

Note that element isolation may be performed using, for example, a STI (Shallow Trench Isolation) method instead of the above-described injection method. At this time, chlorine-based etching gas, for example, is used for dry etching of the compound semiconductor stacked structure 2.

Figure 1C:
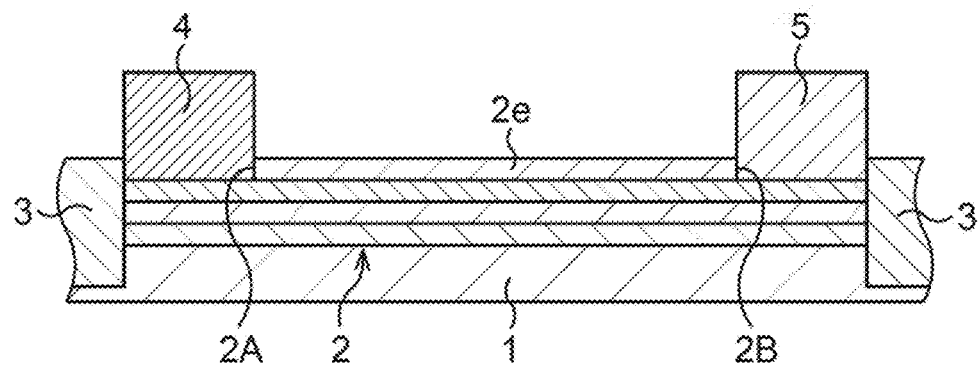

Subsequently, as illustrated in FIG. 1C, a source electrode 4 and a drain electrode 5 are formed.

In detail, first, electrode trenches 2A, 2B are formed in planned formation positions (planned electrode formation positions) of the source electrode and the drain electrode in a surface of the compound semiconductor stacked structure 2.

A resist is applied to the surface of the compound semiconductor stacked structure 2. The resist is processed by lithography, and openings to expose a surface of the compound semiconductor stacked structure 2, the openings corresponding to the planned electrode formation positions, are formed in the resist. Consequently, a resist mask having the openings is formed.

By using this resist mask, the planned electrode formation positions of the cap layer 2d are dry etched and removed until a surface of the electron supply layer 2c is exposed. Consequently, the electrode trenches 2A, 2B to expose the planned electrode formation positions of the surface of the electron supply layer 2c are formed. As an etching condition, inert gas such as Ar and chlorine-based gas such as Cl$_2$ are used as etching gas, and, for example, a flow rate of Cl$_2$ is set to be 30 sccm, a pressure is set to be 2 Pa, and a RF input power is set to be 20 W. Note that the electrode trenches 2A, 2B may be formed by etching to the middle of the cap layer 2d or may be formed by etching to the electron supply layer 2c or further.

The resist mask is removed by ashing or the like.

A resist mask for forming the source electrode and the drain electrode is formed. Here, for example, an eaves-structure two-layer resist suitable for a vapor deposition method and a liftoff method is used. This resist is applied on the compound semiconductor stacked structure 2, and openings to expose the electrode trenches 2A, 2B are formed. Consequently, the resist mask having the openings is formed.

By using this resist mask, Ta/Al, for example, is deposited as an electrode material on the resist mask including the inside of the openings to expose the electrode trenches 2A, 2B by, for example, the vapor deposition method. A thickness of Ta is about 20 nm and a thickness of Al is about 200 nm. The resist mask and Ta/Al deposited thereon are removed by the lift-off method. Thereafter, the SiC substrate 1 is heat-treated at a temperature of about 400° C. to 1000° C., for example, about 600° C. in, for example, a nitrogen atmosphere, and remaining Ta/Al is brought into ohmic contact with the electron supply layer 2c. If the ohmic contact of Ta/Al with the electron supply layer 2c is obtained, the heat treatment is sometimes unnecessary. Consequently, the source electrode 4 and the drain electrode 5, a part of the electrode material of which fills the electrode trenches 2A, 2B, are formed.

Figure 2A:
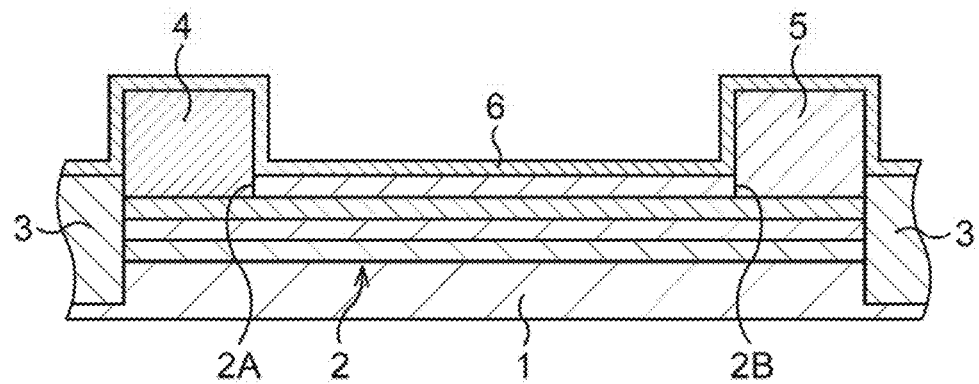
FIG. 2A to FIG. 2C are schematic cross-sectional views illustrating the manufacturing method of the AlGaN/GaN HEMT according to the first embodiment in order of steps, continuously from FIG. 1C.

Subsequently, as illustrated in FIG. 2A, a protective insulating film 6 is formed.

In detail, an insulating material, for example, a silicon nitride (SiN) is deposited with a thickness of, for example, about 50 nm over the whole surface of the compound semiconductor stacked structure 2 by using a plasma CVD method or the like. Consequently, the protective insulating film 6 is formed. For the formation of the protective insulating film 6, silane ($SiH_4$) is used as a Si source and ammonia ($NH_3$) is used as a N source, for example.

Figure 2B:
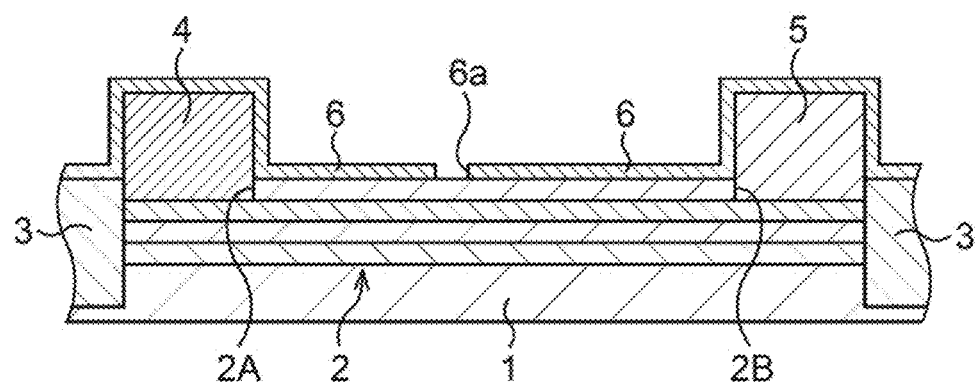

Subsequently, as illustrated in FIG. 2B, a trench 6a is formed in the protective insulating film 6.

In detail, first, a resist is applied on the whole surface of the protective insulating film 6 by, for example, a spin coat method. As the resist, a PMMA (brand name) which is manufactured by Microchem Corp., and is, for example, an electron beam resist, is used. The applied resist is irradiated with an electron beam having a length of 0.1 μm in a current direction thereby to be exposed to light, and is developed. Consequently, a resist mask having an opening is formed.

Next, by using the resist mask, the protective insulating film 6 is dry etched until a surface of a second electron supply layer 2c2 is exposed in a bottom portion of the opening. As etching gas, for example, $SF_6$ is used. Consequently, in the protective insulating film 6, the trench 6a which is a through trench whose width is about 600 nm and which exposes a surface of the cap layer 2d is formed.

The resist mask is removed by ashing using oxygen plasma or wetting using a chemical solution.

Figure 2C:
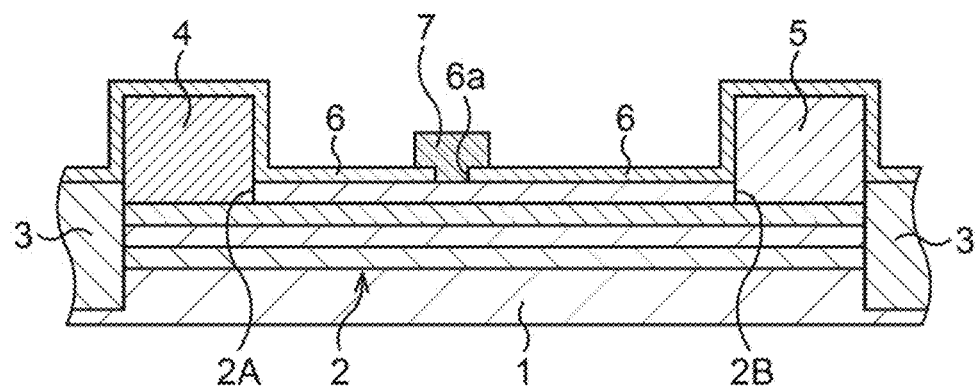

Subsequently, as illustrated in FIG. 2C, a gate electrode 7 is formed.

In detail, first, a resist mask for forming the gate electrode is formed. Here, for example, an eaves-structure two-layer resist suitable for the vapor deposition method and the lift-off method is used. This resist is applied on the protective insulating film 6, and an opening which exposes a portion of the trench 6a in the protective insulating film 6 is formed. Consequently, the resist mask having the opening is formed.

By using this resist mask, Ni/Au, for example, is deposited as an electrode material on the resist mask including the inside of the opening which exposes the portion of the trench 6a in the protective insulating film 6 by, for example, the vapor deposition method. A thickness of Ni is about 30 nm and a thickness of Au is about 400 nm. The resist mask and Ni/Au deposited thereon are removed by the lift-off method. Consequently, the gate electrode 7, a part of the electrode material of which fills the trench 6a, is formed.

Thereafter, through various processes such as the formation of an interlayer insulating film, the formation of wirings connected to the source electrode 4, drain electrode 5, and the gate electrode 7, the formation of an upper protective film, and the formation of connection electrodes exposed in an uppermost surface, the AlGaN/GaN HEMT according to this embodiment is formed.

Figure 9:
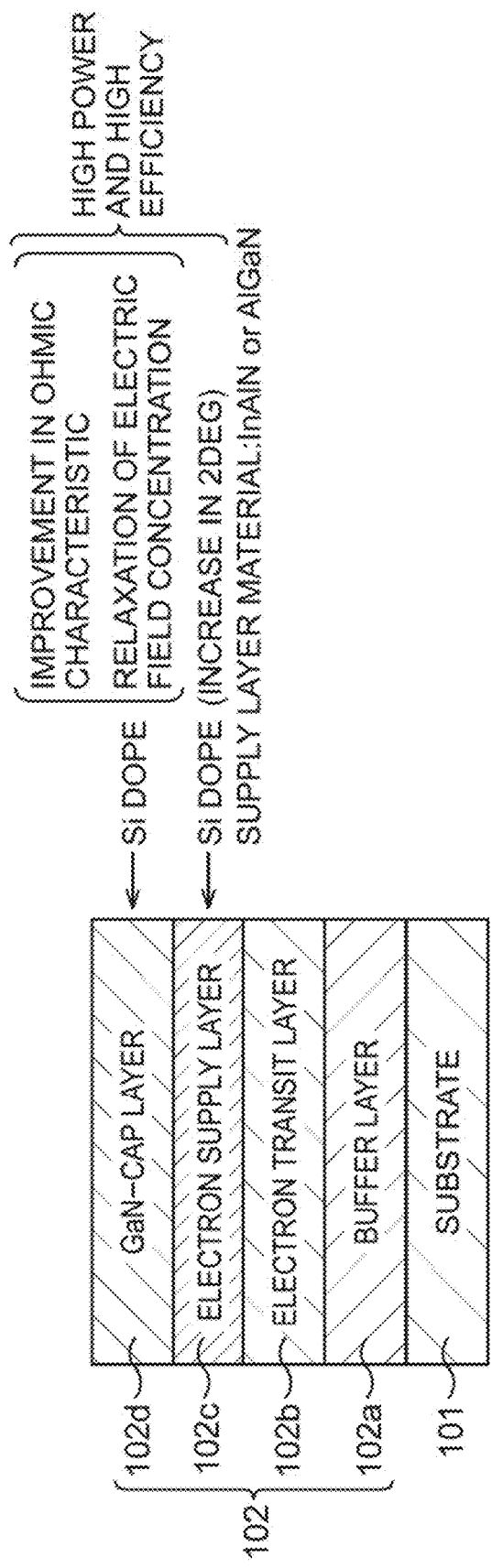
FIG. 9 is a schematic cross-sectional view schematically illustrating a configuration of the compound semiconductor stacked structure in the conventional AlGaN/GaN HEMT.
Figure 10A:
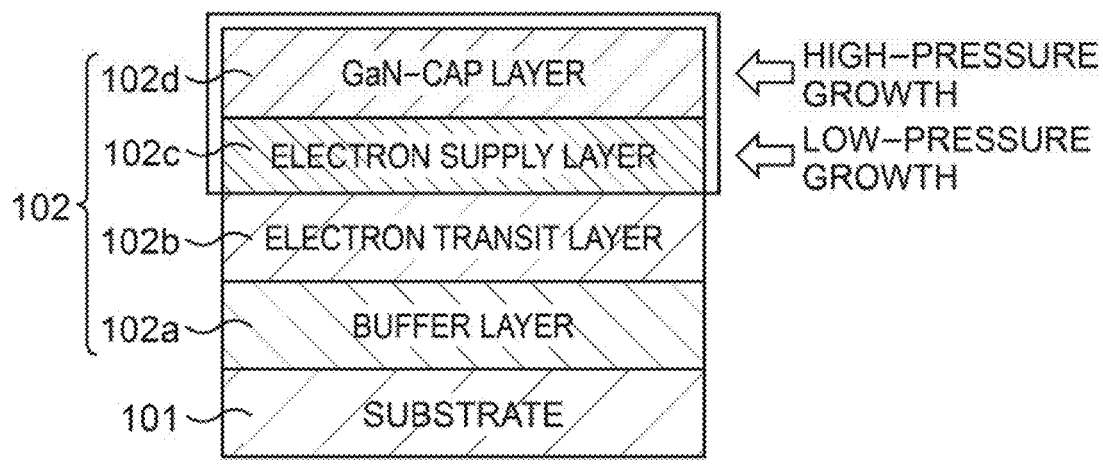
FIG. 10A to FIG. 10C are schematic views for explaining problems in the conventional AlGaN/GaN HEMT.
Figure 10B:
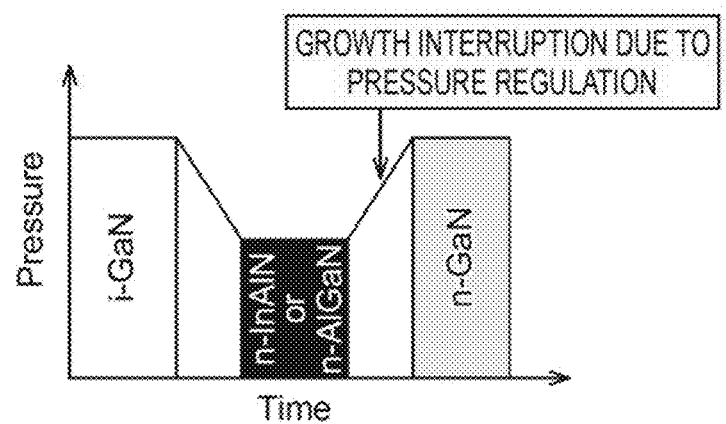
Figure 10C:
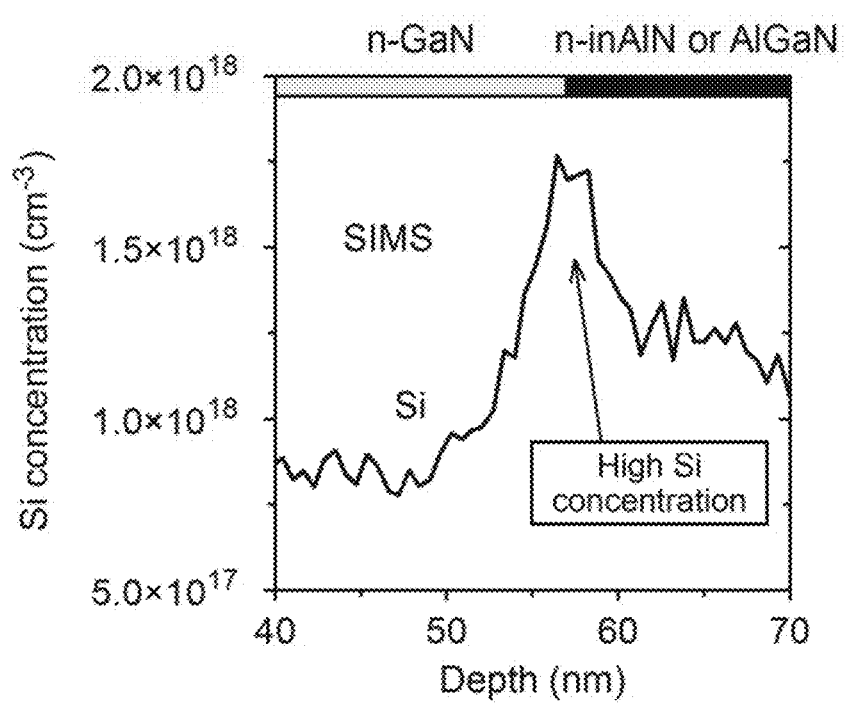

Hereinafter, operations and effects which the AlGaN/GaN HEMT according to this embodiment exhibits will be described based on a comparison with a conventional example. As the conventional example, by using a compound semiconductor stacked structure 102 illustrated in FIG. 9, an AlGaN/GaN HEMT was formed similarly to this embodiment.

Figure 4:
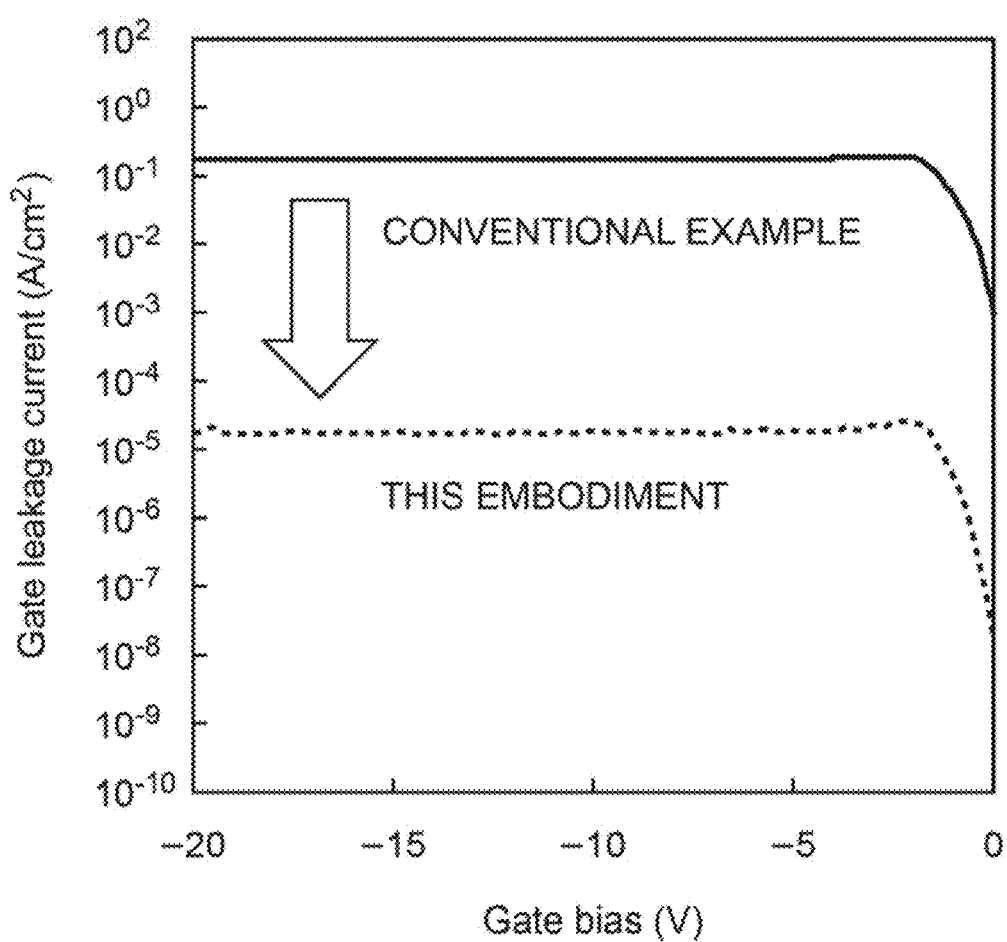
FIG. 4 is a characteristic chart illustrating a result of examining behavior of leak currents at a time of applying a reverse bias to AlGaN/GaN HEMTs of the first embodiment and a conventional example.

Behavior of leak currents at a time of applying a reverse bias to the AlGaN/GaN HEMTs of the conventional example and this embodiment was examined. FIG. 4 illustrates results. In the chart, a solid line indicates the result of the conventional example and a dotted line indicates the result of this embodiment, respectively. Here, the reverse bias was applied between the gate electrode and the drain electrode of each of the AlGaN/GaN HEMTs, and the leak currents were measured.

As illustrated in FIG. 4, in this embodiment compared with the conventional example, the leak current was reduced by about four digits, and extensive improvement in a leak characteristic was confirmed.

Figure 5A:
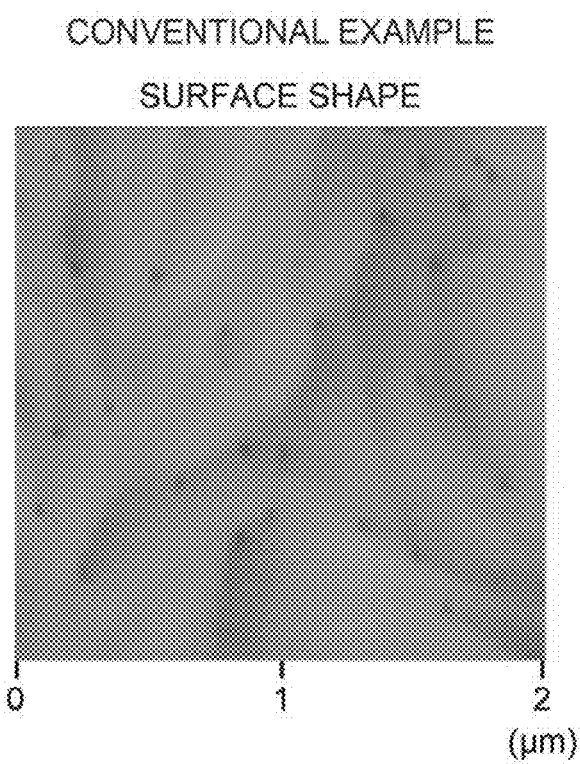
FIG. 5A and FIG. 5B are views of pictures illustrating a result of evaluating a compound semiconductor stacked structure in the AlGaN/GaN HEMT of the conventional example by a conductive AFM.
Figure 5B:
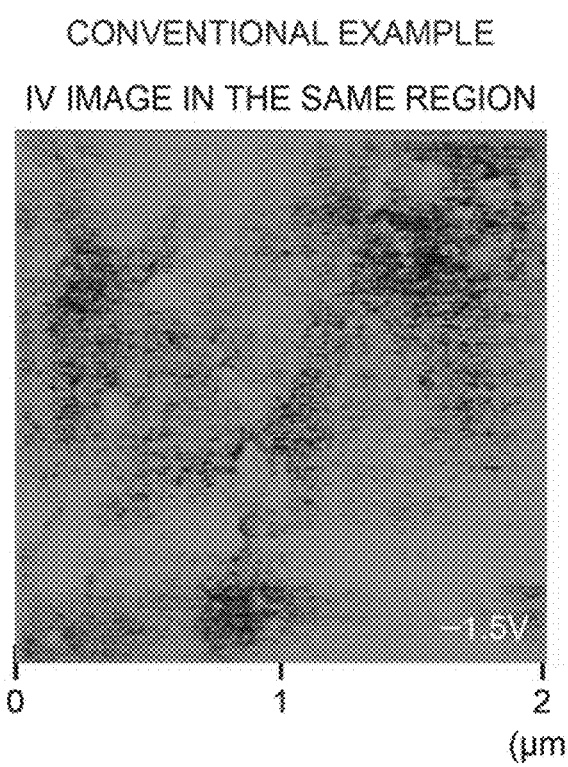
Figure 6A:
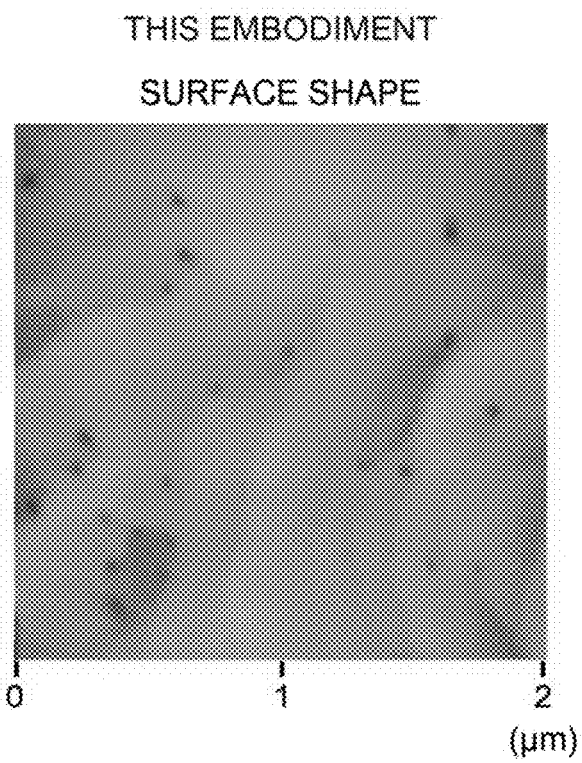
FIG. 6A and FIG. 6B are views of pictures illustrating a result of evaluating a compound semiconductor stacked structure in the AlGaN/GaN HEMT of this embodiment by the conductive AFM.
Figure 6B:
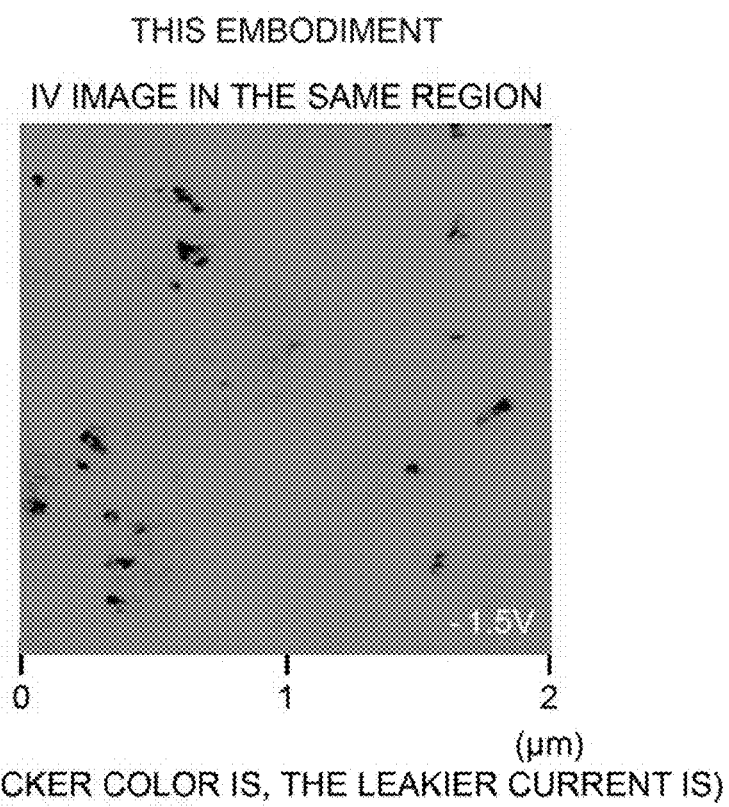

The compound semiconductor stacked structure in each of the AlGaN/GaN HEMTs of the conventional example and this embodiment was evaluated by a conductive AFM. FIG. 5A and FIG. 5B illustrate a result of the conventional example and FIG. 6A and FIG. 6B illustrate a result of this embodiment, respectively. In both FIG. 5A and FIG. 5B and FIG. 6A and FIG. 6B, FIG. 5A and FIG. 6A illustrate surface shapes of the compound semiconductor stacked structures and FIG. 5B and FIG. 6B illustrate IV images in the same regions as those in FIG. 5A and FIG. 6A, respectively.

The conductive AFM is a method of applying bias to a probe of an AFM and measuring minute current which flows in a sample, and enables visual and quantitative observation of a withstand-voltage deterioration portion caused by a defect or the like. Regarding the conventional example in FIG. 5A and FIG. 5B, it is understood that many leak paths exist. In contrast, regarding this embodiment in FIG. 6A and FIG. 6B, the leak path cannot be seen except a crystal defect referred to as dislocation.

As described above, according to this embodiment, it is possible to obtain a highly reliable AlGaN/GaN HEMT which suppresses occurrence of collapse, improves withstand voltage and a leak characteristic, and achieves higher power and higher efficiency of a device.

Note that in this embodiment, a Schottky type AlGaN/GaN HEMT in which the gate electrode 7 is in contact with the surface of the compound semiconductor stacked structure 2 is described, but application to a MIS type AlGaN/GaN HEMT is also possible. In the MIS type AlGaN/GaN HEMT, for example, the protective insulating film 6 is formed as a gate insulating film, and the gate electrode 7 may be formed on the compound semiconductor stacked structure 2 with the protective insulating film 6 interposed therebetween. Further, for example, the gate insulating film is formed under the protective insulating film 6, and the gate electrode 7 can also be formed on the compound semiconductor stacked structure 2 with the gate insulating film interposed therebetween.

As the gate insulating film, for example, $Al_2O_3$ is deposited. $Al_2O_3$ is deposited by, for example, an atomic layer deposition method (ALD method). Consequently, the gate insulating film is formed.

Note that the deposition of $Al_2O_3$ may be performed by, for example, a plasma CVD method, a sputtering method, or the like instead of the ALD method. Further, instead of depositing $Al_2O_3$, a nitride or oxynitride of Al may be used. Besides the above, the gate insulating film may be formed using an oxide, nitride, or oxynitride of Si, Hf, Zr, Ti, Ta, or W, C, or two or more of the above appropriately selected and deposited in a multilayer manner.

Second Embodiment

In this embodiment, a power supply device to which the AlGaN/GaN HEMT according to the first embodiment is applied is disclosed.

Figure 7:
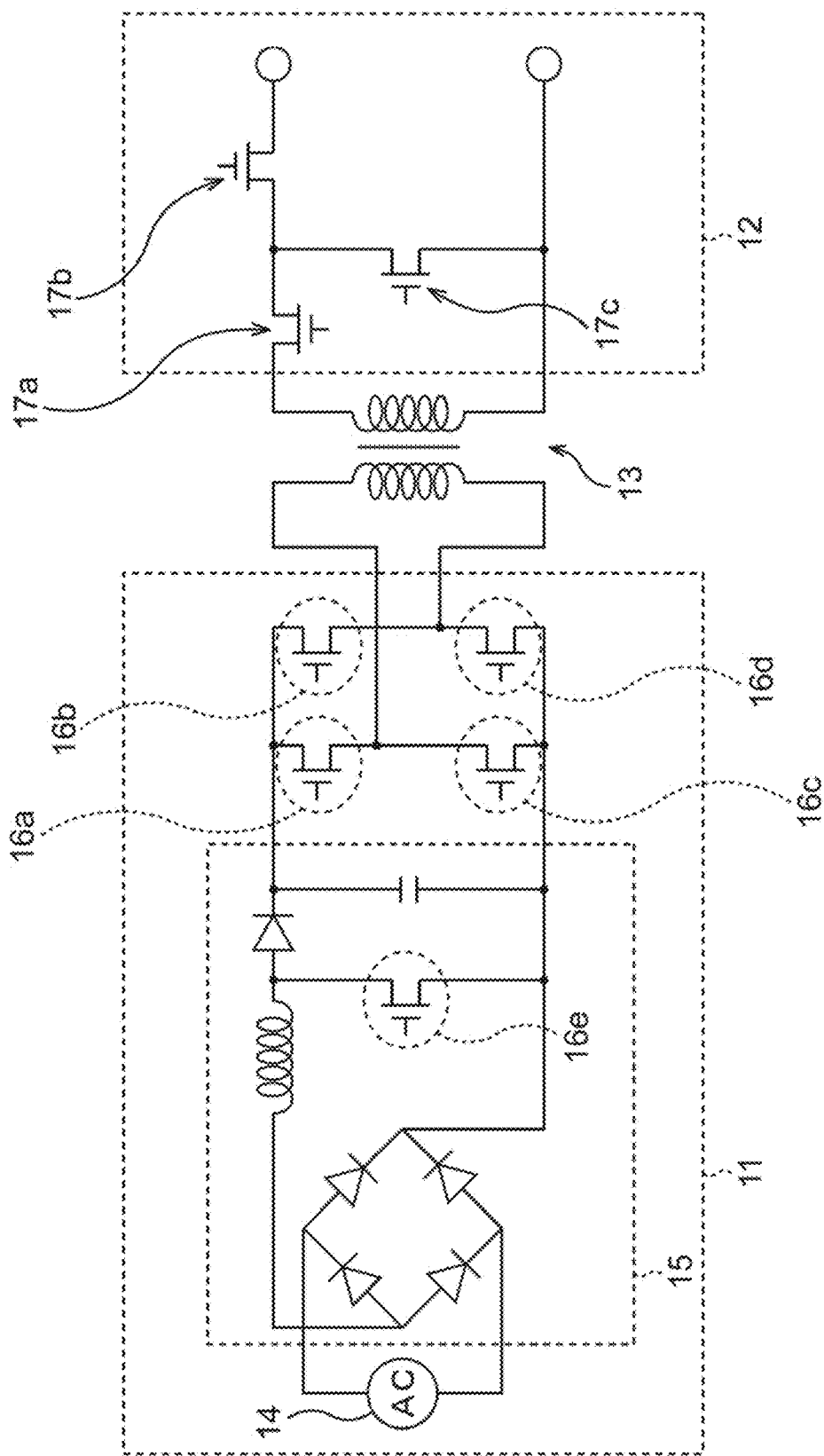
FIG. 7 is a connection diagram illustrating a schematic configuration of a power supply device according to a second embodiment.

FIG. 7 is a connection diagram illustrating a schematic structure of the power supply device according to the second embodiment.

The power supply device according to this embodiment is configured to include a high-voltage primary-side circuit 11 and a low-voltage secondary-side circuit 12, and a transformer 13 disposed between the primary-side circuit 11 and the secondary-side circuit 12.

The primary-side circuit 11 is configured to include an AC power supply 14, a so-called bridge rectifying circuit 15, and a plurality of (four, here) switching elements 16a, 16b, 16c, 16d. Further, the bridge rectifying circuit 15 has a switching element 16e.

The secondary-side circuit 12 is configured to include a plurality of (three, here) switching elements 17a, 17b, 17c.

In this embodiment, the switching elements 16a, 16b, 16c, 16d, 16e of the primary-side circuit 11 are each the AlGaN/GaN HEMT according to the first embodiment. On the other hand, the switching elements 17a, 17b, 17c of the secondary-side circuit 12 are each an ordinary MIS FET using silicon.

In this embodiment, a highly reliable AlGaN/GaN HEMT which suppresses occurrence of collapse, improves withstand voltage and a leak characteristic, and achieves higher power and higher efficiency of a device is applied to a power supply circuit. Consequently, a power supply circuit which is highly reliable and has high power is achieved.

Third Embodiment

In this embodiment, a high-frequency amplifier to which the first AlGaN/GaN HEMT is applied is disclosed.

Figure 8:
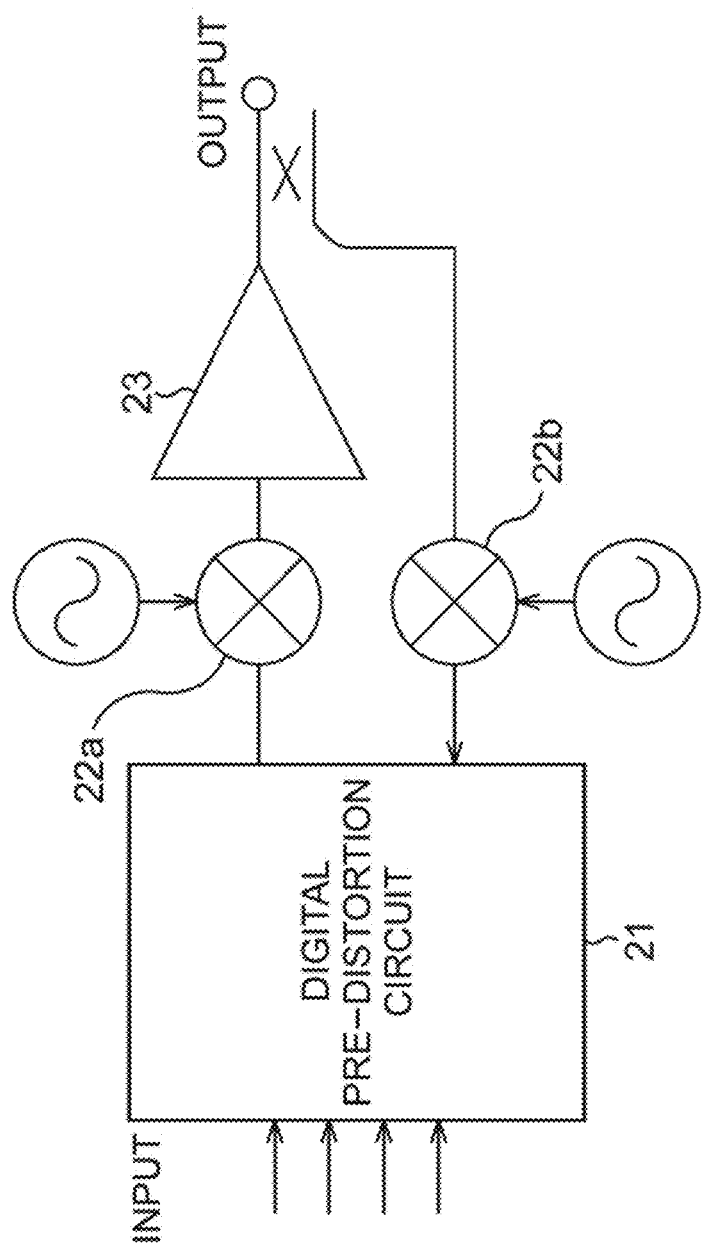
FIG. 8 is a connection diagram illustrating a schematic configuration of a high-frequency amplifier according to a third embodiment.

FIG. 8 is a connection diagram illustrating a schematic structure of the high-frequency amplifier according to the third embodiment.

The high-frequency amplifier according to this embodiment is configured to include a digital pre-distortion circuit 21, mixers 22a, 22b, and a power amplifier 23.

The digital pre-distortion circuit 21 compensates nonlinear distortion of an input signal. The mixer 22a mixes the input signal whose nonlinear distortion has been compensated and an AC signal. The power amplifier 23 amplifies the input signal mixed with the AC signal, and has the AlGaN/GaN HEMT according to the first embodiment. Note that in FIG. 8, the high-frequency amplifier has a configuration which, for example, by changing of the switches, enables a signal of an output side to be mixed with the AC signal by the mixer 22b and to be sent out to the digital pre-distortion circuit 21.

In this embodiment, a highly reliable AlGaN/GaN HEMT which suppresses occurrence of collapse, improves withstand voltage and a leak characteristic, and achieves higher power and higher efficiency of a device is applied to a high-frequency amplifier. Consequently, a high-frequency amplifier which is highly reliable and has high withstand voltage is achieved.

Other Embodiment

In the first to third embodiments, the AlGN/GaN HEMTs are exemplified as the compound semiconductor devices. Regarding the compound semiconductor device, besides the AlGaN/GaN HEMT, the embodiments can be applied to the following HEMTs.

Example 1 of other HEMTs

In this example, an InAlN/GaN HEMT is disclosed as the compound semiconductor device.

InAlN and GaN are compound semiconductors whose lattice constants can be made close to each other by composition. In this case, in the above-described first to third embodiments, the electron transit layer is formed of i-GaN, an intermediate layer is formed of i-InAlN, the electron supply layer is formed of n-InAlN, and the cap layer is formed of n-GaN. Further, because little piezoelectric polarization occurs in this case, two-dimensional electron gas is generated mainly by spontaneous polarization of InAlN.

According to this example, similarly to the above-described AlGaN/GaN HEMT, a highly reliable InAlN/GaN HEMT which suppresses occurrence of collapse, improves withstand voltage and a leak characteristic, and achieve higher power and higher efficiency is achieved.

Example 2 of other HEMTs

In this example, an InAlGaN/GaN HEMT is disclosed as the compound semiconductor device.

GaN and InAlGAN are compound semiconductors, a lattice constant of the latter of which can be made smaller than that of the former by composition. In this case, in the above-described first to third embodiments, the electron transit layer is formed of i-GaN, the intermediate layer is formed of i-InAlGaN, the electron supply layer is formed of n-InAlGaN, and the cap layer is formed of n-GaN.

According to this example, similarly to the above-described AlGaN/GaN HEMT, and similarly to the above-described InAlN/GaN HEMT, a highly reliable InAlGaN/GaN HEMT which suppresses occurrence of collapse, improves withstand voltage and a leak characteristic, and achieves higher power and higher efficiency of a device is achieved.

According to the above-described various embodiments, it is possible to obtain a highly reliable compound semiconductor device which suppresses occurrence of collapse, improves withstand voltage and a leak characteristic, and achieves higher power and higher efficiency of a device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising
a compound semiconductor stacked structure, the compound semiconductor stacked structure comprising:
an electron transit layer;
an electron supply layer formed above the electron transit layer, the electron supply layer containing an n-type impurity; and
a cap layer formed above the electron supply layer, wherein
in the electron supply layer, a concentration of the n-type impurity contained therein is non-uniform in a film thickness direction and a concentration of the n-type impurity in a surface of the cap layer side is lower than a maximum concentration of the n-type impurity in the electron supply layer.

2. The compound semiconductor device according to claim 1, wherein in the electron supply layer, the concentration of the n-type impurity contained therein decreases gradually from a surface of the electron transit layer side toward the surface of the cap layer side.

3. The compound semiconductor device according to claim 1, wherein in the electron supply layer, the concentration of the n-type impurity contained therein becomes the maximum concentration in a middle between the surface of the electron transit layer side and the surface of the cap layer side.

4. The compound semiconductor device according to claim 1, wherein in the electron supply layer, a concentration of the n-type impurity in a region of the electron transit layer side from a region where the cap layer and the electron supply layer are in contact with each other is $1 \times 10^{17}/cm^3$ or more.

5. The compound semiconductor device according to claim 1, wherein the cap layer contains an n-type impurity.

6. A manufacturing method of a compound semiconductor device comprising
forming a compound semiconductor stacked structure, the compound semiconductor stacked structure comprising:
an electron transit layer;
an electron supply layer formed above the electron transit layer, the electron supply layer containing an n-type impurity; and
a cap layer formed above the electron supply layer, wherein
the electron supply layer is formed so that a concentration of the n-type impurity contained therein is non-uniform in a film thickness direction and a concentration of the n-type impurity in a surface of the cap layer side is lower than a maximum concentration of the n-type impurity in the electron supply layer.

7. The manufacturing method of the compound semiconductor device according to claim 6, wherein the electron supply layer is formed so that the concentration of the n-type impurity contained therein decreases gradually from a surface of the electron transit layer side toward the surface of the cap layer side.

8. The manufacturing method of the compound semiconductor device according to claim 6, wherein the electron supply layer is formed so that the concentration of the n-type impurity contained therein becomes the maximum concentration in a middle between the surface of the electron transit layer side and the surface of the cap layer side.

9. The manufacturing method of the compound semiconductor device according to claim 6, wherein in the electron supply layer, a concentration of the n-type impurity in a region of the electron transit layer side from a region where the cap layer and the electron supply layer are in contact with each other is $1 \times 10^{17}/cm^3$ or more.

10. The manufacturing method of the compound semiconductor device according to claim 6, wherein the cap layer contains an n-type impurity.

11. A power supply circuit comprising:
a transformer; and
a high-voltage circuit and a low-voltage circuit sandwiching the transformer, the high-voltage circuit comprising a transistor, the transistor comprising
a compound semiconductor stacked structure, the compound semiconductor stacked structure comprising:
an electron transit layer;
an electron supply layer formed above the electron transit layer, the electron supply layer containing an n-type impurity; and
a cap layer formed above the electron supply layer, wherein
in the electron supply layer, a concentration of the n-type impurity contained therein is non-uniform in a film thickness direction and a concentration of the n-type impurity in a surface of the cap layer side is lower than a maximum concentration of the n-type impurity in the electron supply layer.

12. A high-frequency amplifier which amplifies an input high-frequency voltage to output the amplified high-frequency voltage, the high-frequency amplifier comprising
a transistor, the transistor comprising
a compound semiconductor stacked structure, the compound semiconductor stacked structure comprising:
an electron transit layer;
an electron supply layer formed above the electron transit layer, the electron supply layer containing an n-type impurity; and
a cap layer formed above the electron supply layer, wherein
in the electron supply layer, a concentration of the n-type impurity contained therein is non-uniform in a film thickness direction and a concentration of the n-type impurity in a surface of the cap layer side is lower than a maximum concentration of the n-type impurity in the electron supply layer.

* * * * *